United States Patent [19]

Johnston, Jr. et al.

[11] Patent Number: 4,888,624
[45] Date of Patent: * Dec. 19, 1989

[54] SEMICONDUCTOR DEVICES EMPLOYING HIGH RESISTIVITY IN-BASED COMPOUND GROUP III-IV EPITAXIAL LAYER FOR CURRENT CONFINEMENT

[75] Inventors: Wilbur D. Johnston, Jr., Mendham; Robert F. Karlicek, Jr., South Plainfield; Judith A. Long, Millburn; Daniel P. Wilt, Scotch Plains, both of N.J.

[73] Assignee: American Telephone and Telegraph Company, AT&T Bell Laboratories, Murray Hill, N.J.

[*] Notice: The portion of the term of this patent subsequent to Apr. 21, 2004 has been disclaimed.

[21] Appl. No.: 183,796

[22] Filed: Apr. 20, 1988

Related U.S. Application Data

[63] Continuation-in-part of Ser. No. 4,919, Jan. 20, 1987, abandoned, which is a continuation-in-part of Ser. No. 621,071, Jun. 15, 1984, Pat. No. 4,660,208.

[51] Int. Cl.$^4$ .......................... H01L 33/00; H01S 3/19
[52] U.S. Cl. .......................... 357/16; 357/17; 372/46; 437/129
[58] Field of Search .......................... 372/44, 45, 46, 48; 357/16, 17; 437/129

[56] References Cited

U.S. PATENT DOCUMENTS

| | | | |
|---|---|---|---|
| 4,193,835 | 3/1980 | Inoue | 156/606 |
| 4,482,423 | 11/1984 | Besomi | 156/622 |
| 4,573,255 | 3/1986 | Gordon | 29/574 |
| 4,595,454 | 6/1986 | Dautremont-Smith | 156/647 |
| 4,660,208 | 4/1987 | Johnston, Jr. et al. | 372/46 |

OTHER PUBLICATIONS

D. P. Wilt et al., "Channeled Substrate Buried . . .", *Appl. Phys. Lett.*, 44 (3), 1 Feb. 1984, pp. 290–292.

J. P. Donnelly et al., "High–Resistivity Layers in N-InP Produced by Fe Ion Implantation", *Solid–State Electronics*, vol. 21, No. 1, Jan. 1978, pp. 475–477.

"InGaAsP Double-Channel-Planar-Buried Heterostructure Laser Diode (DC-PBH LD) with Effective Current Confinement", *J. of Lightwave Tech.*, vol. LT-1, No. 1 (Mar., 1983), I. Mito et al., pp. 195–202.

"The Growth of Epitaxial InP by the Chloride Process in Nitrogen and in the Presence of Phosphine", *J. of Crystal Growth*, vol. 61, pp. 695–697, (1983), P. L. Giles et al.

"UV Absorption Spectroscopy for Monitoring Hydrive Vapor14 Phase Epitaxy of InGaAsP Alloys", *J. Appl. Phys.*, vol. 60, Jul. 15, 1986, pp. 794–799, R. F. Karlicek et al.

*Primary Examiner*—James W. Davie
*Attorney, Agent, or Firm*—W. Koba

[57] ABSTRACT

High resistivity In-based compound Group III-V epitaxial layers are used to prevent substantial current flow through a region of a semiconductor device, such as a CSBH, DCPBH, EMBH or CMBH laser, a LED, a photodiode, a HBT, or a FET. Also described is a hydride VPE process for making the high resistivity material doped with Fe. The Fe is supplied by a volatile halogenated Fe compound, and the extend of pyrolysis of the hydride is limited to allow transport of sufficient dopant to the growth area.

12 Claims, 2 Drawing Sheets

SEMICONDUCTOR DEVICES EMPLOYING HIGH RESISTIVITY IN-BASED COMPOUND GROUP III-IV EPITAXIAL LAYER FOR CURRENT CONFINEMENT

CROSS REFERENCE TO RELATED APPLICATIONS

This application is a continuation-in-part of application Ser. No. 004,919 filed on Jan. 20, 1987 now abandoned, which, in turn, is a continuation-in-part of application Ser. No. 621,071 filed on June 15, 1984, now Pat. No. 4,660,208.

BACKGROUND OF THE INVENTION

This invention relates to semiconductor devices such as light emitting devices, light detecting devices, light modulating devices, and transistors, and to methods of making such devices.

A common problem in the fabrication of low threshold buried heterostructure (BH) lasers in the InGaAsP-/InP materials system is the control of leakage currents (i.e., currents which bypass the active region of the device). These currents lead to high lasing threshold, low differential quantum efficiency, abnormal temperature dependence of threshold current, and rollover of the lightcurrent (L-I) characteristic. All of these factors have a significant negative impact on the use of BH lasers in transmitters for fiber optic communication systems.

One possible solution to the problem of leakage current in buried heterostructure lasers is the controlled introduction of high resistivity material into the device structure. This high resistivity material could be used to block current flow through undesired leakage paths. Previously, high resistivity liquid phase epitaxial (LPE) $Al_{0.65}Ga_{0.35}As$ (lightly Ge-doped) material has been utilized for current confinement in AlGaAs/GaAs buried heterostructure lasers, but subsequent attempts to produce high resistivity LPE InP material for this purpose have not been successful. Deuteron bombardment has also been shown to produce highly resistive material from p-type InP, but this material is not expected to remain highly resistive during subsequent processing. In particular, because the high resistivity is related to deuteron implant damage, the resistivity anneals out at the high temperatures (e.g., above about 600° C.) required for subsequent LPE growth.

In addition, bifurcated, reverse-biased p-n junctions have also been reported for constraining current to flow through the active region of InGaAsP/InP lasers. These blocking junctions have been fabricated by the implantation of Be into n-InP substrates, by the diffusion of Cd into n-InP substrates, and by the epitaxial growth of a p-InP layer onto an n-InP substrate. But, all of these devices are impaired to some extent by leakage currents because of the imperfect blocking characteristics of the reverse-biased junctions.

More recently, D. P. Wilt et al. reported in *Applied Physics Letters*, Vol. 44, No. 3, p. 290 (February 1984) that InP/InGaAsP channel substrate buried heterostructure (CSBH) lasers with relatively low leakage currents and low lasing thresholds can be fabricated by incorporating into the structure a high resistivity Fe-ion-implanted layer which constrains pumping current to flow through the active region. The high resistivity layer is produced by an Fe-ion implant into an n-type InP substrate followed by an annealing treatment prior to LPE growth. Although the resistivity of the Fe-ion-implanted layer is stable even after being subjected to the high temperatures characteristic of LPE growth, the thinness of the Fe-implanted layer (about 0.4 $\mu$m) renders it difficult to reproducibly position the thin active layer (about 0.1-0.2 $\mu$m thick) adjacent thereto. When the active layer is not so placed, shunt paths are created which allow leakage current to flow around the active layer. In addition, the thinness of the Fe-implanted layer permits a process known as double injection to create leakage current directly through the Fe-implanted layer; that is, injection of carriers from the p-type and n-type layers which bound the thin Fe-implanted layer produce undesirable current flow across it. Hence, high performance (low threshold, high efficiency) devices are hard to fabricate reproducibly.

SUMMARY OF THE INVENTION

In accordance with one aspect of our invention, a semiconductor device includes a semiconductor body in which substantial current is prevented from flowing through a region of the body by including in the region an In-based compound Group III-V epitaxial layer having the physical characteristics (e.g., relatively high resistivity and large thickness) of an Fe-doped InP-based layer grown by metallo-organic chemical vapor deposition (MOCVD) or hydride vapor phase epitaxy (VPE). In one embodiment, the device has an active region, and the layer has an opening through which current is constrained to flow to the active region.

Another aspect of our invention is a method of fabricating such devices, which includes an Fe-doped, In-based compound Group III-V semiconductor region, comprising the steps of (1) forming a precursor gas comprising a carrier gas, a volatile dopant compound, a volatile indium compound, and a Group V hydride, (2) directing the precursor gas through a heated chamber to contact a heated deposition body, and (3) inducing deposition of the compound semiconductor on the body, characterized in that the carrier gas comprises an inert gas, the dopant compound includes iron, the concentration of hydrogen in the precursor gas is limited to prevent excessive precipitation of iron, and the concentrations of the volatile indium compound at the body and of the Group V hydride are maintained sufficient to result in the desired deposition. In one embodiment of the method the concentration of hydrogen is limited by controlling the amount of pyrolysis of the hydride.

In another embodiment of our invention, we have found that reproducible BH lasers with low leakage currents, low lasing thresholds, excellent high frequency response and good reliability can be fabricated by incorporating into the structure a relatively thick, high resistivity Fe-doped In-based epitaxial layer. This layer is preferably grown by MOCVD or hydride VPE but may also be grown by any of several other epitaxial techniques including, for example, chemical beam epitaxy (CBE). Importantly, InP: Fe layers which are relatively thick (e.g., 1-4 $\mu$m) and highly resistive (e.g., $10^3$-$10^9$ $\Omega$-cm) are realized by these processes, characteristics which are crucial to reducing leakage currents and increasing yields in a variety of devices. In this regard, the use of hydride VPE in accordance with the invention is particularly advantageous because the high resistivity InP: Fe can be reproducibly grown adjacent to masked features (e.g., mesas) without experiencing either growth on the mask itself or unusual crystalline artifacts (e.g., protrusions) adjacent to the mask.

For example, using hydride VPE to grow high resistivity InP: Fe blocking layers alongside the mesa of an InP/InGaAsP etched mesa buried heterostructure (EMBH) distributed feedback (DFB) 1.3 μm laser, we have achieved single mode operation, CW threshold currents of less than 10 mA, and output powers up to 20 mW. With stripe contacts 6 μm wide, a small signal bandwidth of more than 15 GHz was measured.

On the other hand, using MOCVD to grow a high resistivity InP: Fe layer on an InP substrate, InP/InGaAsP CSBH 1.3 μm and 1.5 μm lasers with CW threshold currents as low as about 10 mA and 8 mA, respectively, at room temperature (23° C.) have been achieved in accordance with our invention. These devices also had excellent high frequency performance as evidenced by a small signal bandwidth as high as 8 GHz and modulation rates as high as 2.0 Gb/s.

In a similar fashion, InP: Fe epitaxial layers may be utilized as the current-blocking layers of a double channel planar buried heterostructure (DCPBH) lasers and covered (or capped) mesa buried heterostructure (CMBH) lasers as discussed hereinafter.

In addition, the invention is also suitable for use in LEDs, photodiodes, modulators, heterojunction bipolar transistors (HBTs), field effect transistors (FETs) and other In-based compound Group III-V devices in which substantial current is prevented from flowing through a region of the device.

BRIEF DESCRIPTION OF THE DRAWING

Our invention, together with its various features and advantages, can be readily understood from the following, more detailed description taken in conjunction with the accompanying drawing, in which, in the interests of clarity, the figures have not been drawn to scale.

DETAILED DESCRIPTION

Figure 1:
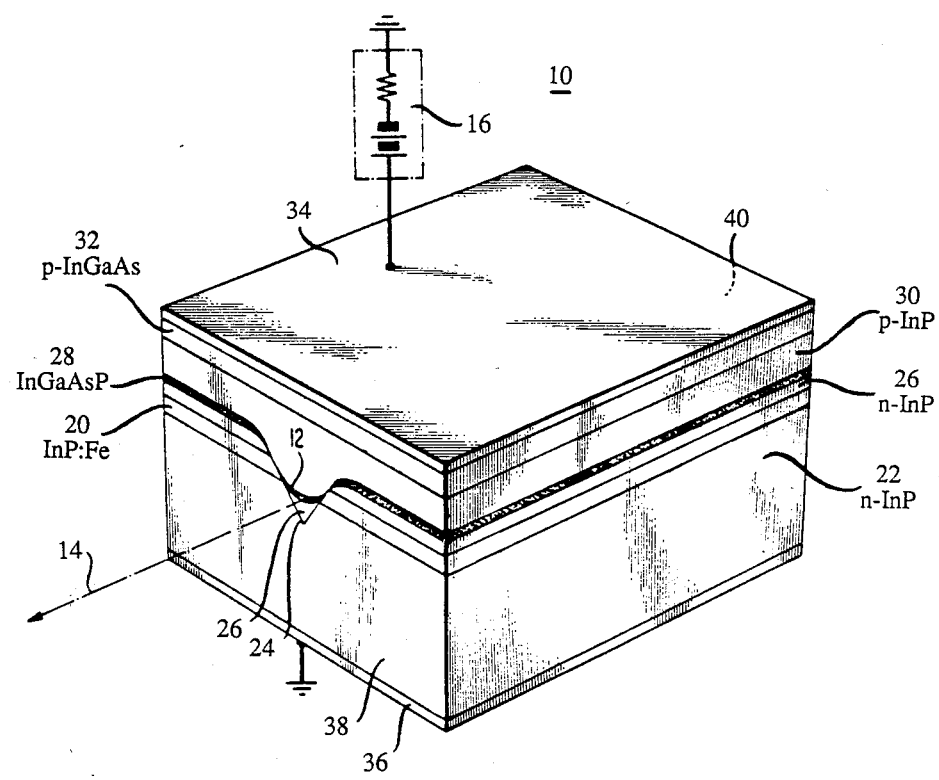
FIG. 1 is an isometric view of a CSBH light emitting device in accordance with one embodiment of our invention.

The semiconductor light emitting device shown in FIG. 1 may be used as a laser or as an edge-emitting LED. In either case, the device 10 includes an active region 12 in which the recombination of electrons and holes causes radiation to be emitted at a wavelength characteristic of the bandgap of the semiconductor material of the active region (e.g., about 1.0-1.65 μm for InGaAsP depending on the specific composition of the quaternary). The radiation is directed generally along axis 14 and is primarily stimulated emission in the case of a laser and primarily spontaneous emission in the case of an LED.

This recombination radiation is generated by forward-biasing a p-n junction which causes minority carriers to be injected into the active region. Source 16, illustratively depicted as a battery in series with a current-limiting resistor, supplies the forward bias voltage and, in addition, provides pumping current at a level commensurate with the desired optical output power. In a laser, the pumping current exceeds the lasing current threshold.

In general, the device inlcudes means for constraining the pumping current to flow in a relatively narrow channel through the active region 12. As illustrated, this constraining means comprises a bifurcated, high resistivity Fe-doped InP epitaxial layer 20, and the active region 12 has the shape of a stripe which lies in the rectangular opening (top view) of the bifurcated layer 20. Note, in the case of a surface emitting LED the layer 20, rather than being bifurcated, might take the shape of an annulus surrounding a cylindrical or mesa-like active region.

The structure shown in FIG. 1 is known as a channel-substrate buried heterostructure (CSBH) laser which includes an n-InP substrate 22 and an Fe-doped high resistivity InP epitaxial layer 20 which is bifurcated by a groove 24. The groove is etched or otherwise formed through layer 20 into substrate 22. A preferred technique for controllably etching the groove in the shape of a V is described in U.S. Pat. No. 4,595,454 granted to W. C. Dautremont-Smith and D. P. Wilt on June 17, 1986. That patent is incorporated herein by reference.

Briefly, this etching technique entails the use of a composite etch mask comprising a thin (e.g., 18–22 Å) native oxide layer formed on a (100)-oriented InP surface and a $SiO_2$ layer plasma deposited on the native oxide. The native oxide layer may be grown using plasma enhanced or thermal methods. The mask is patterned using standard photolithography and plasma etching so that the mask openings (~ <2.2 μm wide) are parallel to the [011] direction. V-grooves that are 3.0 μm deep with only (111)B-oriented sidewalls are formed by room temperature etching in HCl-rich etchants such as 3:1 $HCl:H_3PO_4$.

The following essentially lattice-matched epitaxial layers are then grown by LPE on the etched wafer: an n-InP first cladding layer 26 (the central portion of which fills at least the bottom portion of groove 24); an unintentionally doped InGaAsP layer 28; a p-InP second cladding layer 30; and a p-InGaAs (or p-InGaAsP) contact-facilitating layer 32. Layer 28 includes crescent-shaped active region 12 which, in practice, becomes separated from the remainder of layer 28 because epitaxial growth does not take place along the top edges of the groove 24. Provided that nonradiative recombination at the interface with high resistivity layer 20 is not significant, the active layer is preferably vertically positioned within the thickness of the high resistivity layer 20 in order to reduce leakage current. However, if the active layer is below layer 20, but near enough thereto (i.e., ~ <1 μm away), leakage currents are still significantly reduced and nonradiative recombination at the layer 20 interface becomes much less of a problem.

Although the high resistivity InP: Fe layer 20 is formed directly on the substrate 22, it may also be formed on an epitaxial buffer layer (not shown) grown on the substrate. In either case, we have found that the high resistivity of layer 20 is advantageously achieved by the MOCVD process described by W. D. Johnston, Jr. and J. A. Long in U.S. Pat. No. 4,716,130 issued on Dec. 29, 1987 based on a copending application which is incorporated herein by reference.

Briefly, this MOCVD process involves the use of a ferrocene-based or iron pentacarbonyl-based dopant precursor (or a combination of such precursors) in conjunction with an indium-organic material such as an indium alkyl. Advantageously, trimethylindium is used as the source of indium. Alternatively, an adduct may be formed first between the indium-organic and an alkyl phosphine. The adduct is introduced into the gas stream by a flowing gas (e.g., hydrogen or an inert gas) through a bubbler containing it. A source of phosphorus (e.g., phosphine) is also introduced into the gas flow. The dopant precursor is introduced to yield a mole ratio of iron to indium in the gas stream in the range $1.2 \times 10^{-4}$ to $1 \times 10^{-5}$.

Relatively thick (e.g., 1-4 $\mu$m) InP: Fe layers with resistivities as high as $1 \times 10^9$ $\Omega$-cm are achievable by this process which is also applicable to other In-based compound Group III-V compositions (e.g., InGaP, InAsP, InGaAsP, InGaAlP). For lasers, however, a resistivity in excess of about $1 \times 10^6$ $\Omega$-cm is desirable.

Alternatively, the high resistivity Fe-doped In-based compound Group III-V epitaxial layer may be grown by hydride VPE. In the prior art this has been a difficult task because suitable volatile iron compounds typically cannot be transported using a $H_2$ carrier at temperatures normally used for growth ($T_\sim > 650°$ C.); that is, the presence of too much $H_2$ will reduce the volatile Fe compound and may cause excessive Fe metal to be deposited on the walls of the reactor. On the other hand, the growth of InP in an inert carrier is difficult and has been reported only for a trichloride system (using $PCl_3$) when $PH_3$ was added to stimulate growth. See P. L. Giles et al., *Journal of Crystal Growth*, Vol. 61, p. 695 (1983). However, in accordance with one aspect of our invention an Fe-doped, In-based compound Group III-V semiconductor region is formed by hydride VPE using an inert carrier gas (e.g., $N_2$, Ar or He), a volatile compound including Fe (e.g., a halogenated Fe compound such as $FeCl_2$, $FeBr_2$, or $FeOCl$) and by preventing excessive precipitation of Fe metal (e.g., by limiting the pyrolysis of $PH_3$). In one embodiment high resistivity InP: Fe is grown using $N_2$ as a carrier under conditions of limited $PH_3$ pyrolysis in the reactor. By using an inert carrier and limiting the presence of $H_2$ to that formed by the reaction of HCl with $In_{(l)}$ and $Fe_{(s)}$ and the pyrolysis of $PH_3$, we have achieved transport of sufficient $FeCl_2$ to produce InP: Fe with a resistivity of about $5 \times 10^4$ to $2 \times 10^8$ $\Omega$-cm. Resistivities lower than $5 \times 10^4$ are readily achieved, if so desired.

A high resistivity layer prepared by either the MOCVD or hydride VPE process described above maintains its high resistivity even after being subjected to the high temperatures of subsequent process steps.

Returning now to FIG. 1, electrical contact is made to the device via metal electrodes 34 and 36 on layer 32 and substrate 22, respectively. Source 16 is connected across electrodes 34 and 36.

Figure 2:
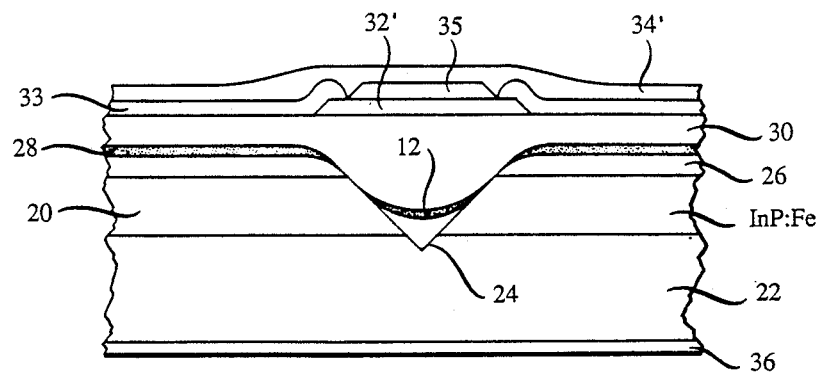
FIG. 2 is an end view of another embodiment of a CSBH device in accordance with our invention.

Although a broad-area contact is depicted in FIG. 1 by layer 32 and electrode 34, it also is possible to delineate a stripe geometry contact as shown in FIG. 2. Here components with primed notation in FIG. 2 correspond to those with the same reference numerals in FIG. 1. Thus, the contact-facilitating layer 32' is etched to form a stripe and is aligned within the stripe-shaped opening of $SiO_2$ layer 33. A stripe-shaped metal contact 35 is formed on layer 32' in the opening of $SiO_2$ layer 33, and a broad area electrode 34' is then formed over the top of the device. A contact configuration of this type reduces device capacitance and hence increases high speed performance.

The CSBH laser also includes means for providing optical feedback of the stimulated emission, typically a pair of separated, parallel, cleaved facets 38 and 40 which form an optical cavity resonator as shown in FIG. 1. The optical axis of the resonator and the elongated direction of the stripe-shaped active region 12 are generally parallel to one another. Other feedback techniques are also suitable, however, including well-known distributed feedback gratings, for example.

EXAMPLE I

The following example describes the fabrication of an InP/InGaAsP CSBH laser in accordance with one embodiment of our invention. Unless otherwise stated, various materials, dimensions, concentrations, operating parameters, etc., are given by way of illustration only and are not intended to limit the scope of the invention.

In this example we demonstrate for the first time the utilization of a high resistivity, Fe-doped InP layer grown by MOCVD as the base structure for a InGaAsP/InP CSBH 1.3 $\mu$m laser. Pulsed threshold currents as low as 11 mA and pulsed light output as high as 14 mW at 100 mA have been achieved for this structure, with good yield and uniformity of devices. The superior high frequency response expected for a device with a semi-insulating base structure has been verified, with small signal bandwidths exceeding 2.4 GHz. In addition, modulation at rates as high as 2.0 Gb/s has been achieved.

The CSBH lasers, of the type shown in FIG. 2, were fabricated as follows. Using the MOCVD epitaxial reactor described in U.S. Pat. No. 4,716,130 of W. D. Johnston, Jr. and J. A. Long, supra, a single layer 20 of Fe-doped InP was grown on an n-type InP substrate 22 (S-doped LEC material) nominally oriented along the (100) plane (no intentional misorientation was employed).

The Fe-doped layer was between 1 and 4 $\mu$m thick and had a resistivity of at least $1 \times 10^6$ $\Omega$-cm. Then a composite native oxide/$SiO_2$ etching mask was deposited as described in U.S. Pat. No. 4,595,454 of W. C. Dautremont-Smith and D. P. Wilt, supra. The mask was patterned into 2.0 $\mu$m wide windows, and the V-groove 24 for subsequent LPE growth was etched in a mixture of 3:1 $HCl:H_3PO_4$. The mask was then stripped in HF, and the wafer was loaded into a LPE reactor. Prior to the LPE growth, the wafer was protected in an external chamber containing a saturated Sn-In-P solution as described by P. R. Besomi et al. in U.S. Pat. No. 4,482,423 issued on Nov. 13, 1984, which is incorporated herein by reference. The DH (layers 26, 28 and 30) was then grown by LPE at approximately 630° C. These layers included an n-type InP (Sn-doped) layer 26, a nominally undoped InGaAsP ($\lambda_g \approx 1.3$ $\mu$m) layer 28, and a p-type InP (Zn-doped) layer 30. On the DH a contact-facilitating p-type InGaAsP ($\lambda_g \approx 1.2$ $\mu$m, Zn-doped) layer was grown and later etched as described below. The width and thickness of the crescent-shaped active region 12 were typically 2.5 $\mu$m and 0.2 $\mu$m, respectively. Care was taken to grow the active region in the channel and within the thickness of the high resistivity layer 20 in order to reduce leakage current and shunt capacitance. However, even when the active layer was below layer 20, but within about 1 $\mu$m of it, the laser performance exceeded that of prior designs (i.e., either those with Cd-diffused base structures or Fe-ion implanted base structures).

After the LPE growth was completed, standard channel substrate buried heterostructure laser processing was performed. First, SiO$_2$ was deposited over the surface of the wafer and patterned into stripes directly over the buried active regions, with the alignment performed by etching of the wafer edges to reveal the buried structure. The contact facilitating layer of the structure was then etched in 10:1:1 H$_2$SO$_4$:H$_2$O$_2$:H$_2$O to leave InGaAsP stripes 32' as shown in FIG. 2, and the SiO$_2$ etch mask was stripped in HF. Another SiO$_2$ layer 33 was then deposited and patterned to form windows over the stripes of layer 32'. The photoresist used in patterning the SiO$_2$ layer 33 was then used as a liftoff mask for an evaporated AuZnAu contact 35. After alloying the AuZnAu contact 35, the wafer (substrate) was lapped and a back (n-side) contact pad of AuGe was deposited and alloyed, using a similar liftoff technique. A front (p-side) TiPt overlay metallization (not shown) was deposited and sintered, and both front and back sides of the wafer were plated with Au layers 34' and 36 to serve as contacts and as bonding pads. Finally, the wafer was scribed and cleaved into individual chips 250 $\mu$m long by 500 $\mu$m wide.

The pulsed light-current (L-I) and dL/dI characteristics of the lasers were measured. One laser had a threshold current at 30° C. of 21 mA and achieved 10 mW of output power at a current of 85 mA. The light output at 100 mA was 11.8 mW. The peak slope efficiency was 0.18 mW/mA, equal to our best results on other lasers with good current confinement. The peak efficiency was maintained well throughout this range, dropping slightly at the higher power levels, possibly due to current flow around the edges of the active region or current flow into regions of the layer 28 not responsible for stimulated emission (e.g., the "wings" of the crescent-shaped active region). The I dV/dI saturation for this device was measured to be near ideal at threshold, indicative of good current confinement.

The good intra-wafer uniformity available for this type of device was illustrated by tight distributions in threshold current and light output at 100 mA under pulsed conditions. For a random sample of 25 unbonded devices from this wafer, the mean threshold current was 20.1 mA, the median threshold current was 19.2 mA, and the standard deviation of the distribution was 4.6 mA. The mean light output at 100 mA was 9.93 mW, the median was 11.4 mW, and the standard deviation was 1.8 mW.

The burn-in characteristics of a group of lasers with this structure, under 60° C. and 3 mW automatic power control burn-in conditions, illustrated their good stability. The degradation rates measured on bonded, purged lasers were as low as 1 mA per thousand hours at the 60° C.-3 mW burn-in conditions. Purging is described by E. I. Gordon et al. in U.S. Pat. No. 4,573,255 issued on Mar. 4, 1986. This degradation rate is low enough for these lasers to be used in optical communications systems.

The far field emission patterns were measured at 3 mW CW output power. The measured half power beamwidths were 17° and 28° parallel and perpendicular to the junction plane, respectively. An optical emission spectrum exhibited a few longitudinal modes centered at a wavelength of 1.2925 $\mu$m.

The modulation response of this laser was particularly good. Rise and fall times measured with a high speed driver were approximately 0.3 ns and high speed modulation was achieved at rates as high as 2 Gb/s with good eye patterns. The small signal response was plotted as a function of optical power output. The 3 dB cutoff frequency varied from 2.1 GHz at the lasting threshold to a maximum of more than 2.4 GHz at 1 mW of optical power. Thereafter, this cutoff frequency fell to 2.0 GHz at 2 mW and 1.8 GHz at 3 mW.

EXAMPLE II

Using procedures similar to those of Example I, we fabricated InP/InGaAsP CSBH lasers operating at about 1.3 $\mu$m or 1.5 $\mu$m. The shorter wavelength lasers had CW room temperature thresholds of about 10 mA and 3 dB cutoff frequencies as high as 8 GHz. The longer wavelength lasers had corresponding thresholds of 8 mA and are expected to have comparable cutoff frequencies.

EXAMPLE III

This example describes the fabrication of high resistivity InP: Fe epitaxial layers by a hydride VPE process. As above, other In-based compound Group III-V materials (e.g., InGaP, InAsP, InGaAsP, InGaAlP) can also be made by this process. These high resistivity layers have been incorporated into EMBH and CNBH lasers of the type shown in FIGS. 4 and 5, respectively, and can be used in other device structures as well. As before, the various materials, dimensions, concentrations, etc., are given by way of illustration only and are not intended to limit the scope of the invention unless otherwise stated.

The reactor used for the growth of the InP: Fe is described by R. F. Karlicek et al. in *Journal of Applied Physics*, Vol. 60, p. 794 (1986). Note, the reactor contains a quartz growth tube, and to grow Group III-V compounds containing Al, the interior walls of the tube should be protected by a coating such as graphite. For the growth of InP: Fe the source gases included HCl and PH$_3$ mixtures (5% and 2%, respectively) in ultra high purity (99.999% pure) N$_2$ carrier gas which was obtained either from a standard compressed gas cylinder or from purified N$_2$ boiloff from a liquid nitrogen tank. The concentration of the input reactive gases was selected using electronic mass flow controllers. The transport of iron as the dichloride FeCl$_2$ was accomplished by flowing HCl (5% in N$_2$) through iron powder (99.999% pure) placed on a quartz frit or by flowing HCl over crumpled iron foil (99.999% pure) placed in a separate tube. The outlet of the tube or the frit was located downstream of the In$_{(l)}$ source in the reactor source region. The In$_{(l)}$ source temperature, the Fe source temperature, and the growth temperature were kept constant. The In and Fe source temperature was 700° C. (a range of 700°-750° C. is suitable), and the growth temperature was also 700° C. (a range of 650°-700° C. is suitable). Between growth experiments, Pd-purified H$_2$ was made to flow through the reactor in place of N$_2$.

Using an optical spectrometer which monitored the wavelength region between 200 and 330 nm, the extent of PH$_3$ pyrolysis was determined by measuring the absorbance by P$_4$ at 230 nm. Since P$_4$ is the dominant species (except for unpyrolyzed PH$_3$), the concentration of P$_2$ was not monitored optically and was not included in the computation of the degree of PH$_3$ pyrolysis during growth. A suitable range of PH$_3$ pyrolysis is 17-65%. Above 65% the dynamics of the process produce either etching or no epitaxial growth. Less than 17% is difficult to achieve because PH$_3$ pyrolysis on the quartz growth tube at 650°–700° C. produces some $H_2$ in the growth region. In general, we have achieved reproducible results, with the growth rate and surface morphology of the InP: Fe being essentially independent of the degree of pyrolysis in the range of 17–26%. The transport of $FeCl_2$ was also monitored optically, and the concentration was computed from published thermodynamic data for the Fe-Cl system.

The growth of InP: Fe was performed on <100> oriented InP: S substrates which were degreased prior to placement in the reactor. Growth was also performed adjacent to mesas etched from epitaxial layers grown on the substrate. Following the preheating of the substrate under a dilute $PH_3$ flow (e.g., $8 \times 10^{-3}$ atm), a brief etch was performed by initiating the flow of HCl (e.g., $4 \times 10^{-4}$ atm, no $PH_3$) through the Fe source. This etch is optional depending on the device being fabricated. Growth was initiated by starting the flow of HCl over the $In_{(l)}$ source region. The specific growth conditions were as follows: $PH_3$ pressure of $17.9 \times 10^{-3}$ atm (a range of $14-18 \times 10^{31\ 3}$ atm is suitable), InCl pressure of about $4.0 \times 10^{-3}$ atm (not critical), HCl pressure over the Fe of $1.0 \times 10^{-4}$ atm (a range of $0.6-1.0 \times 10^{-4}$ is suitable) and total flow of 2250 sccm (2250–2300 is suitable). These conditions produced InP: Fe growth rates of 16 μm/hr (12–20 μm/hr in the ranges indicated). The resulting InP: Fe layer was measured to have a resistivity of about $2.4 \times 10^8$ Ω-cm ($5 \times 10^4 - 2.4 \times 10^8$ in the ranges indicated). These resistivities have been obtained in n-type InP having a net carrier concentration in the range of $5 \times 10^{14}$ to $1 \times 10^{16}$ cm$^{-3}$.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, other epitaxial growth techniques may be suitable for growing high resistivity Fe-doped In-based compound Group III-V layers. Thus, chemical beam epitaxy (CBE) could be utilized with, for example, trimethyl indium, phosphine (cracked to yield $P_2$ and/or $P_4$) and ferrocene to provide sources of In, P and Fe respectively, in a $H_2$ stream. As with conventional molecular beam epitaxy, growth takes place at low pressures in an ultrahigh vacuum chamber. In CBE the beams are generated by passing the gases through appropriate nozzles, and the substrate (e.g., InP) is heated to the growth temperature.

Thus, the invention contemplates the ability to grow by a variety of epitaxial techniques, In-based compound Group III-V epitaxial layers having the physical characteristics (e.g., resistivities of $\sim > 10^3$ Ω-cm and thicknesses of $\sim > 1$ μm) of Fe-doped InP-based layers grown by either MOCVD or hydride VPE as described above.

In addition, while our invention has been discussed with reference to lasers and LEDs, it will be appreciated by those skilled in the art that it is applicable to other semiconductor devices (e.g., photodiodes, modulators, HBTs, FETs) in which substantial current is prevented from flowing through a region of the device. An example of a vertical InP FET, in which the gate is formed on the side wall of a V-groove through an InP: Fe layer, is described by C. Cheng in copending application Ser. No. 896,772 filed on Aug. 15, 1986.

Figure 3:
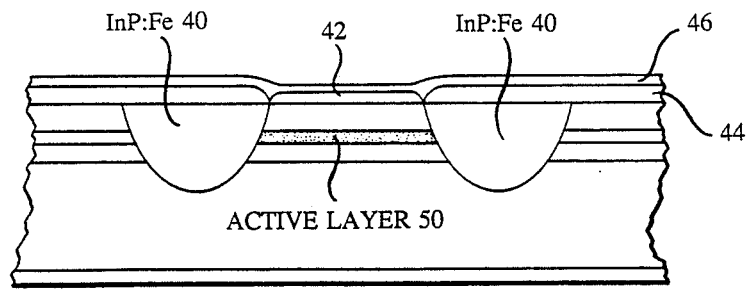
FIG. 3 is an end view of a DCPBH device in accordance with still another embodiment of our invention.

Other alternative device embodiments of our invention involve the DCPBH (FIG. 3), EMBH (FIG. 4) and CMBH (FIG. 5) configurations. The conventional DCPBH laser is described generally by I. Mito et al. in *Journal of Lightwave Technology*, Vol. LT-1, No. 1, p. 195 (1983). It employs LPE regrowth in the channels to form reverse-biased blocking junctions which constrain current to flow through the elongated mesa containing the active layer. In accordance with a DCPBH embodiment of our invention shown in FIG. 3, however, the LPE regrowth of blocking junctions is replaced by growth of InP: Fe zones 40 on each side of the mesa. A restricted (e.g., stripe geometry) contact 42 is delineated on top of the mesa by a patterned dielectric layer 44 (e.g., $SiO_2$) and an electrode 46 overlays the top of the device. In this fashion, current is constrained by the InP: Fe zones 40 and the dielectric layer 44 to flow essentially only through the mesa and hence through the active layer 50.

Figure 4:
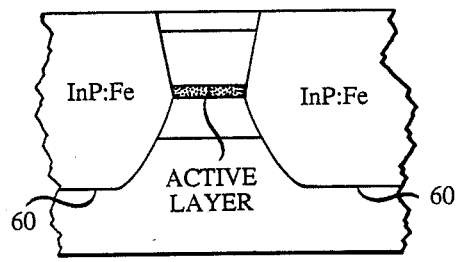
FIG. 4 is an end view of a re-entrant EMBH device in accordanced with yet another embodiment of our invention.

A re-entrant EMBH laser is shown in FIG. 4. The active layer is located near the neck of the re-entrant mesa and high resistivity InP: Fe is grown adjacent to the mesa to constrain current to flow primarily through the mesa and through the active layer. A similar EMBH (not shown) has vertical side walls. Lasers of both types have been fabricated using the above-described hydride VPE process to grow the InP: Fe (hydride VPE can also be used to grow the other layers of the laser as well). In both cases the lasers were of the DFB type, being supplied with a well-known first-order diffraction grating (not shown) in the substrate surface 60.

Figure 5:
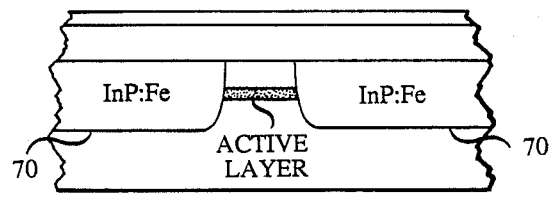
FIG. 5 is an end view of a CMBH device in accordance with one more embodiment of our invention.

In a similar fashion, a CMBH-DFB laser of the type shown in FIG. 5 has been fabricated with a grating on substrate surface 70. Although this type of laser entails three epitaxial growth cycles, it has the advantage that a shorter mesa is used which alleviates some of the difficulty in etching the taller mesas of FIG. 4, for example.

The use of our hydride VPE technique to grow high resistivity blocking layers adjacent to mesas (e.g., as in FIGS. 3–5) is preferred for several reasons: (1) growth does not occur on the mask ($SiO_2$ or $SiN_x$) which remains on the mesa during epitaxial growth of the high resistivity material; (2) undesirable artifacts (e.g., protrusions) adjacent to the mask do not occur; (3) where the mesa is not masked, VPE can be used to planarize the structure; and (4) the VPE process is controllable, being essentially unaffected to any significant extent by the shape of the mesa or the size of the mask overhang.

Finally, it is well known that the active region of the devices described above may include a single active layer or a composite of several layers at least one of which is active (in the light-emitting sense). Thus, in a 1.55 μm InP/InGaAsP laser, the active region may include an InGaAsP layer which emits light at 1.55 μm adjacent another InGaAsP layer ($\lambda = 1.3$ μm) which serves an anti-meltback function during LPE growth. Moreover, several active layers emitting at different wavelengths are also embraced within the definition of an active region.

What is claimed is:
1. A semiconductor device comprising
   a semiconductor body,
   means for applying current to said body, and
   means for preventing substantial current flow through a region of said body, characterized in that said preventing means comprises an In-based compound Group III-V epitaxial layer included in said region and having the physical characteristics of an Fe-doped InP-based MOCVD layer.

2. The device of claim 1 wherein said layer has a thickness of $\sim > 1$ μm.

3. The device of claims 1 or 2 wherein said layer has a resistivity of $\sim > 10^3$ Ω-cm.

4. A semiconductor device comprising
a semiconductor body, p1 means for applying current to said body, and
means for preventing substantial current flow through a region of said body, characterized in that
said preventing means comprises a high resistivity Fe-doped In-based compound Group III-V epitaxial layer included in said region.

5. The device of claim 4 wherein said layer has a thickness of $\sim > 1$ μm.

6. The device of claims 4 or 5 wherein said layer has a resistivity of $\sim > 10^3$ Ω-cm.

7. A semiconductor device comprising
an active region,
electrode means for applying current to said device, and
means for constraining said current to flow in a channel through said active region, characterized in that
said constraining means comprises an In-based compound Group III-V epitaxial layer having an opening through which said channel extends and having the physical characteristics of an Fe-doped InP-based MOCVD layer.

8. The device of claim 7 wherein said layer has a thickness of $\sim > 1$ μm.

9. The device of claims 7 or 8 wherein said layer has a resistivity of $\sim > 10^3$ Ω-cm.

10. A semiconductor device comprising
an active region,
electrode means for applying current to said device, and
means for constraining said current to flow in a channel through said active region, characterized in that
said constraining means comprises a high resistivity Fe-doped In-based compound Group III-V epitaxial layer having an opening through which said channel extends.

11. The device of claim 10 wherein said layer has a thickness of $\sim > 1$ μm.

12. The device of claims 10 or 11 wherein said layer has a resistivity of $\sim > 10^3$ Ω-cm.

* * * * *